(12) United States Patent
Tornare et al.

(10) Patent No.: US 9,892,570 B2
(45) Date of Patent: Feb. 13, 2018

(54) DEVICE FOR DIAGNOSING THE LOSS OF A CONNECTION BETWEEN AN ELECTRONIC CONTROL MODULE AND A GROUND

(71) Applicants: CONTINENTAL AUTOMOTIVE FRANCE, Toulouse (FR); CONTINENTAL AUTOMOTIVE GMBH, Hannover (DE)

(72) Inventors: Jean-Marc Tornare, Colomiers (FR); Christophe Costes, La Salvetat Saint Gilles (FR); Philippe Laurine, Toulouse (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 140 days.

(21) Appl. No.: 15/024,559

(22) PCT Filed: Sep. 29, 2014

(86) PCT No.: PCT/EP2014/002640
§ 371 (c)(1),
(2) Date: Mar. 24, 2016

(87) PCT Pub. No.: WO2015/049045
PCT Pub. Date: Apr. 9, 2015

(65) Prior Publication Data
US 2016/0240022 A1 Aug. 18, 2016

(30) Foreign Application Priority Data
Oct. 4, 2013 (FR) ..................... 13 59623

(51) Int. Cl.
*G01R 31/00* (2006.01)
*G01R 31/02* (2006.01)
*G07C 5/08* (2006.01)

(52) U.S. Cl.
CPC ......... *G07C 5/0808* (2013.01); *G01R 31/007* (2013.01); *G01R 31/025* (2013.01); *G01R 31/026* (2013.01); *G01R 31/006* (2013.01)

(58) Field of Classification Search
CPC .. G07C 5/0808; G07C 5/0816; G01R 31/007; G01R 31/005; G01R 31/025;
(Continued)

(56) References Cited

U.S. PATENT DOCUMENTS 5,166,852 A * 11/1992 Sano ............... H02H 5/105
340/649
5,508,872 A * 4/1996 Khoo ............... H02H 5/105
361/42

(Continued)

FOREIGN PATENT DOCUMENTS

DE 100 02 537 A1 7/2001
DE 10 2007 036680 A1 2/2009
(Continued)

OTHER PUBLICATIONS

International Search Report, dated Nov. 5, 2014, from corresponding PCT application.

*Primary Examiner* — Tung X Nguyen
*Assistant Examiner* — Lee Rodak
(74) *Attorney, Agent, or Firm* — Young & Thompson

(57) ABSTRACT

A device for diagnosing the loss of a connection to a ground (M) of an electronic control module (BCM) of a motor vehicle, noteworthy in that a first branch (B1) for connecting to the ground (M) includes:
elements of unidirectional current conduction (Dd) mounted in parallel with a two-position switch (INT),
(Continued)

the two-position switch (INT) being configured to toggle between a closed short-circuit position of the elements of unidirectional current conduction (Dd) and an open position of diagnostic of the loss of connection to the ground (M) of the electronic control module (BCM) on the first connecting branch (B1), and, elements for generating a current (Idiag) on the first connecting branch (B1).

11 Claims, 4 Drawing Sheets

(58) Field of Classification Search
CPC .. G01R 31/026; G01R 31/006; G01R 31/008; G01R 31/02; G01R 31/021; G01R 31/024; G01R 31/18; G01R 31/08; G01R 31/28; G01R 31/2812; G01R 31/10; G01R 31/31901; G01R 31/041; G01R 27/18; G01R 27/02; G01R 27/04; G01R 27/00; H04B 3/46

USPC ....... 324/503, 508, 509–512, 522, 523, 525, 324/527, 528, 555, 609, 649, 691, 713; 702/1, 57, 58, 59, 64

See application file for complete search history.

(56) References Cited

U.S. PATENT DOCUMENTS 5,587,865 A * 12/1996 Bielig ................. B60T 8/885
307/10.1
2012/0161817 A1 6/2012 Kanayama

FOREIGN PATENT DOCUMENTS

| EP | 0 590 180 A1 | 4/1994 |
| EP | 0 696 849 A2 | 2/1996 |
| EP | 1 134 589 B1 | 9/2001 |
| FR | 2 904 695 A1 | 2/2008 |
| JP | 2009 133815 A | 6/2009 |
| WO | 2008/020408 A2 | 2/2008 |
| WO | 20120164332 A1 | 12/2012 |

* cited by examiner

DEVICE FOR DIAGNOSING THE LOSS OF A CONNECTION BETWEEN AN ELECTRONIC CONTROL MODULE AND A GROUND

The present invention pertains to the field of electronic control in a vehicle and relates more particularly to a device and a method for diagnosing the loss of a connection between an electronic control module and a ground.

A motor vehicle comprises in a conventional manner a main electronic control module (BCM or Body Control Module) of a certain number of items of equipment of the vehicle. Among this equipment mention may be made, for example, of the electrical control system for the windows of the vehicle, the electrical control system for the rear view mirrors, the air conditioning system, the vehicle immobilization system, the central locking system etc.

For safety reasons, as illustrated in FIG. 1, it is known to connect the electronic control module BCM to a ground M, for example to the ground of the battery of the vehicle, by way of two connecting branches: a first connecting branch B1 of logical impedance ZML and a second connecting branch B2 of power impedance ZMP.

It is also known to link other equipment to the first connecting branch B1 and to the second connecting branch B2 in order to connect them to the ground M too.

Thus, in a conventional manner, still with reference to FIG. 1, first electronic control units ECU1 of low power, such as, for example, elements of the dashboard of the vehicle, an electronic module of a door of the vehicle etc., are linked to the ground M by the first connecting branch B1 at the level of a first connection point P1. Likewise, second electronic control units ECU2, of generally greater power, for example a windshield wiper or items of equipment of the engine of the vehicle, are linked to the ground M via the second connecting branch B2 at the level of a second connection point P2.

In order that the power currents I(ECU2) originating from the second electronic control units ECU2 do not damage the electronic control module BCM, it is known to dispose on the second connecting branch B2, between the main electronic control module BCM and the second connection point P2, a unidirectional current conduction means of the diode type D1 blocking the return of said power currents I(ECU2) toward the electronic control module BCM.

In order to safeguard the components of the electronic control module BCM, it is known to diagnose the loss of connection to the ground of the electronic control module BCM on the first connecting branch B1.

Indeed, when a loss of connection to the ground M occurs on the first connecting branch B1, the current originating from the electronic control module BCM no longer passes through said first connecting branch B1 but wholly through the second connecting branch B2, across the diode D1. The loss of connection between the electronic control module BCM and the ground M on the first connecting branch B1 is therefore diagnosed by comparing the voltage value on the second connecting branch B2 with a voltage threshold which is predetermined as explained hereinafter.

Such a diagnostic is carried out by using a diagnostic circuit CD1 linked to the second connecting branch B2, between the diode D1 and the second connection point P2.

As illustrated in FIG. 1, the diagnostic circuit CD1 comprises a first resistor R1 mounted in series with a second resistor R2 connected to a DC power supply $V_N$ of 5 V. An input of a microcontroller (not represented) is linked to a diagnostic point Pdiag situated between the first resistor R1 and the second resistor R2 and defining an input voltage V1diag. The microcontroller can be, for example, a microcontroller of the electronic control module BCM.

When the first connecting branch B1 is connected to the ground M, the diagnostic voltage V1diag(CONN) is given by the formula:

$$V1\text{diag}(CONN) = V_N \times \frac{R1}{R1+R2} - ZML \times [I(ECU1) + I(BCM)] \times \frac{R2}{R1+R2} \quad (1)$$

When the first connecting branch B1 is disconnected from the ground M at the level of a cutoff DIS, as illustrated in FIG. 2, the diagnostic voltage V1diag(DISCONN) is given by the formula:

$$V1\text{diag}(DISCONN) = V_N \times \frac{R1}{R1+R2} - U(D1) \times \frac{R2}{R1+R2} \quad (2)$$

where U(D1) is the voltage defined across the terminals of the diode D1.

The microcontroller periodically measures the input voltage V1diag and compares it with a predetermined voltage threshold. When the input voltage V1diag is greater than said threshold, the connection via the first branch B1 of the electronic control module BCM to the ground M is performed. When the input voltage V1diag is lower than said threshold, the microcontroller diagnoses a loss of connection to the ground of the electronic control module BCM on the first branch B1.

A problem arises when the value of the input voltage V1diag(CONN) measured when the first branch B1 is connected, given by equation (1), and the value of the input voltage V1diag(DISCONN) measured when the first branch B1 is disconnected, given by equation (2), are both very close to the threshold, that is to say when their difference is not sufficiently significant for the microcontroller to be able to reliably diagnose the loss of connection to the ground M of the electronic control module BCM on the first connecting branch B1 although the latter has indeed occurred. Such a diagnostic error entails a lack of reliability of the device, this presenting a significant drawback.

This typical case arises for certain commonplace ranges of values of the voltage U(D1) across the terminals of the diode D1, of the first resistor R1, of the second resistor R2 and of the currents I(BCM) and I(ECU1) flowing on the first connecting branch B1 and originating respectively from the electronic control module BCM and/or from the first electronic control units ECU1.

Thus, for example, for conventional values:

$$\frac{R2}{R1+R2} = 0.75,$$

U(D1)=0.1 V,
ZML=0.3 ohms,
I(BCM)=0.1 A, and
I(ECU1)=0.2 A,
we have:

$$ZML \times [I(ECU1) + I(BCM)] \times \frac{R2}{R1+R2} = 0.07 \text{ V and}$$

-continued $$U(D1) \times \frac{R2}{R1+R2} = 0.075 \text{ V}.$$

In this case, the values of V1diag(CONN) and V1diag (DISCONN) are so close to one another that the microcontroller may not determine with certainty whether the value of the input voltage V1diag measured is greater or less than the predetermined voltage threshold, thus entailing frequent diagnostic errors.

The aim of the present invention is to remedy these drawbacks by proposing a simple and reliable solution for diagnosing a loss of connection to the ground of the electronic control module on the first connecting branch.

For this purpose, the invention relates to a device for diagnosing the loss of a connection to a ground of an electronic control module of a motor vehicle, said device comprising
- a first branch connecting the main electronic control module to the ground, said first connecting branch being designed to receive, at the level of a first connection point, first control currents originating from first electronic control units,
- a second branch connecting the electronic control module to the ground, said second connecting branch being designed to receive, at the level of a second connection point, second control currents originating from second electronic control units, said second connecting branch comprising first means of unidirectional current conduction designed to block said second control currents and,
- a diagnostic circuit connected to the first connecting branch, at the level of a measurement point situated between the electronic control module and the first connection point, and defining a diagnostic voltage for diagnosing a loss of connection to the ground of the electronic control module on the first connecting branch, the device being noteworthy in that the first connecting branch comprises:
- between the electronic control module and the measurement point, second means of unidirectional current conduction mounted in parallel with a two-position switch, said two-position switch being configured to toggle between a closed position for short-circuiting the second means of unidirectional current conduction and an open position for diagnosing the loss of connection to the ground of the electronic control module on the first connecting branch and,
- means for generating a current at the level of the measurement point.

In this instance, the terms "first control currents" are understood to mean currents of low intensity, for example less than 7 A of the main electronic control module and/or of secondary electronic control modules. Likewise, the terms "second control currents" are understood to mean currents of possibly large intensity, for example greater than 250 A and originating, for example, from power equipment of the engine.

Thus, when the electronic control module is connected to the ground by the first connecting branch, when the two-position switch is open and when the means for generating a current generate a current at the level of the measurement point, the voltage measured at the measurement point when the first connecting branch is connected to the electronic control module is noticeably lower, for example by half, than the voltage measured at the measurement point when the first connecting branch is disconnected from the electronic control module.

Stated otherwise, the means for generating a voltage on the second branch make it possible to define a new threshold from which the measured voltage value is sufficiently distant, that is to say noticeably lower than said threshold when the first connecting branch is connected to the ground, or noticeably greater than said threshold when the first connecting branch is disconnected from the ground. The diagnosis of loss of connection to the ground is therefore advantageously both simple and reliable.

According to one aspect of the invention, the ground to which the electronic connection module is connected is the ground of the battery of the vehicle.

Preferably, the means for generating a current comprise a current generator.

Preferably again, the device comprises a microcontroller adapted for measuring the diagnostic voltage and for determining, on the basis of said measured voltage, a loss of connection between the electronic control module and the ground on the first connecting branch.

According to a characteristic of the invention, the microcontroller is adapted for controlling the means for generating a current.

According to one aspect of the invention, the two-position switch and the first means of unidirectional current conduction take the form of a PMOS (P-type Metal-Oxide-Semiconductor) transistor mounted in reverse mode.

According to another aspect of the invention, the second means of unidirectional current conduction take the form of at least one standard diode or one Schottky diode, preferably a plurality of diodes mounted in parallel, making it possible to support currents of high intensity, for example, greater than or equal to 7 A.

The invention also relates to a vehicle, especially a motor vehicle, comprising an electronic control module and a device such as presented above.

In an advantageous manner, the electronic control module comprises said microcontroller, thereby making it possible to simplify the architecture of the vehicle.

The invention also relates to a method of diagnosis, by a diagnostic device such as presented above, of the loss of a connection to a ground of an electronic control module of a motor vehicle, the method being noteworthy in that it comprises:
- a step of opening the two-position switch,
- a step of generating a current, by the means for generating a current, at the level of the measurement point,
- a step of measuring the voltage at the level of the measurement point,
- a step of closing the two-position switch and,
- a step of diagnosing the loss of connection to the ground of the electronic control module on the first connecting branch on the basis of the measured voltage value.

Other features and advantages of the invention will become apparent in the following description, made with reference to the appended figures given by way of non-limiting examples and in which identical reference numbers are given to similar objects.

The invention is described below for its application in a motor vehicle (not represented) but it goes without saying that it can be applicable to any type of vehicle.

The vehicle comprises a main electronic control module (BCM or Body Control Module) of a certain number of items of equipment of the vehicle. Among this equipment mention may be made, for example, of the electrical control system for the windows of the vehicle, the electrical control system for the rear view mirrors, the air conditioning system, the vehicle immobilization system, the central locking system etc.

The electronic control module BCM (FIG. 3) is linked to a ground M, for example of the battery of the vehicle, by way of a first connecting branch B1, called the "electronic ground branch" which is the main connection of the module BCM to the ground M, and of a second connecting branch B2 called the "power ground branch" which is the secondary connection of the electronic control module BCM to the ground M.

Such a redundancy makes it possible to secure the electronic components of the electronic control module BCM in case of loss of the connection to the ground of said module BCM on the first connecting branch or main branch B1.

Figure 1:
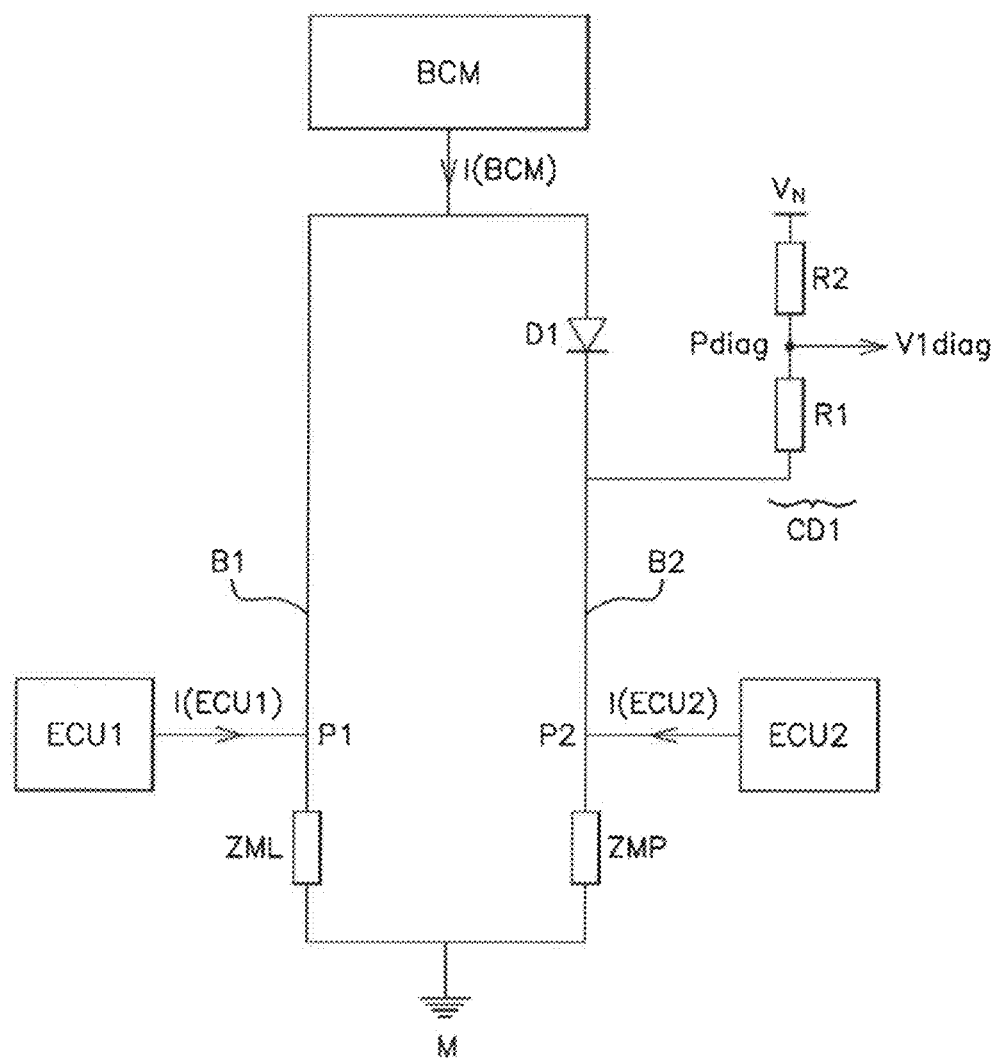
FIG. 1 illustrates a device for diagnosing the loss of a connection to the ground of an electronic control module of the prior art.
Figure 2:
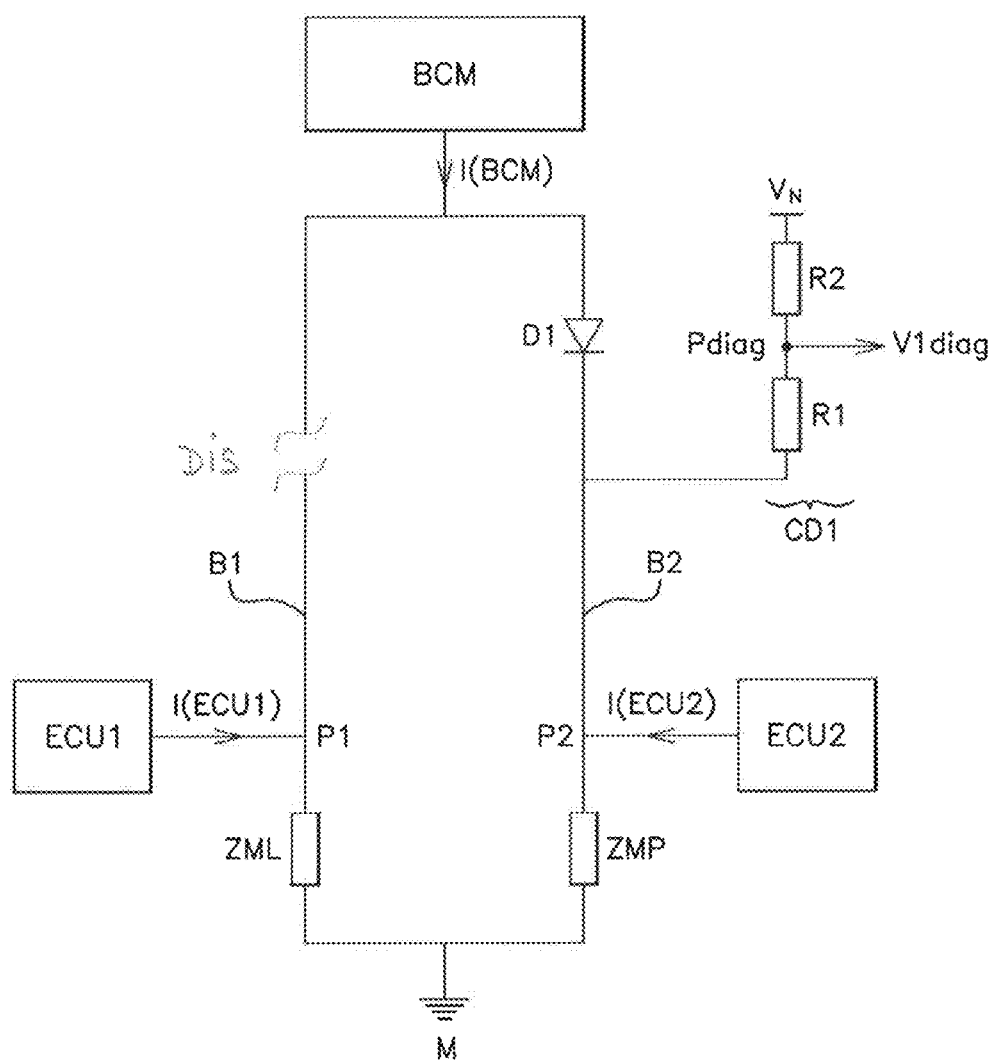
FIG. 2 illustrates the device of FIG. 1 in which the first connecting branch is disconnected from the ground.
Figure 3:
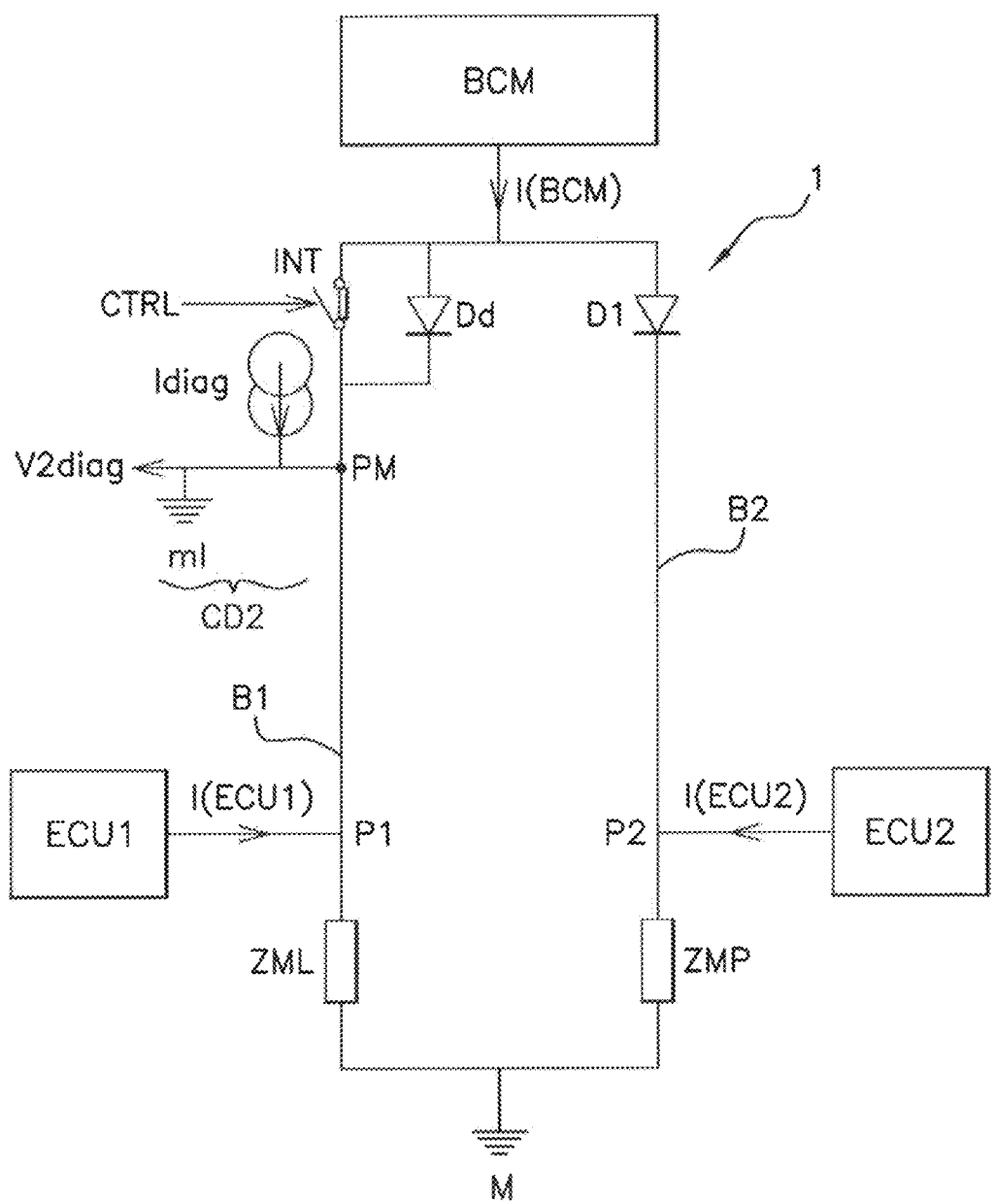
FIG. 3 illustrates a device for diagnosing the loss of a connection to the ground of an electronic control module according to the invention.

In the example illustrated in FIG. 3, the vehicle comprises one or more first electronic control units ECU1 operating at low currents I(ECU1), for example, elements of the dashboard of the vehicle, a vehicle door electronic module, etc, and one or more second electronic control units ECU2 operating at currents I(ECU2) of at least equal or indeed greater intensity, such as, for example, a windshield wiper or equipment of the engine of the vehicle.

The first electronic control unit or units ECU1 are linked to the first connecting branch B1 at the level of a first connection point P1.

Likewise, the second electronic control unit or units ECU2 are linked to the second connecting branch B2 at the level of a second connection point P2.

The vehicle according to the invention comprises a microcontroller which maybe, for example, a microcontroller of the electronic control module BCM and which is adapted for carrying out a diagnosis of loss of connection to the ground of the electronic control module BCM on the first connecting branch B1 such as described hereinafter.

More precisely, the microcontroller is adapted for measuring a diagnostic voltage V2diag and for determining, on the basis of said measured voltage, a loss of connection between the electronic control module BCM and the ground M.

The device according to the invention makes it possible to diagnose a loss of connection to the ground M of the electronic control module BCM on the first connecting branch B1.

With reference to FIG. 3, the device 1 comprises the first connecting branch B1, the second connecting branch B2 and a diagnostic circuit CD2 connected to the first connecting branch B1 at the level of a measurement point PM situated between the electronic control module BCM and the first connection point P1.

The second connecting branch B2 comprises first means of unidirectional current conduction D1 designed to block the power currents I(ECU2) originating from the second electronic control units ECU2 and prevent them from returning along the second connecting branch B2 up to the main electronic control module BCM. Such means of unidirectional current conduction D1 thus make it possible to prevent damage to the electronic control module BCM.

The first means of unidirectional current conduction D1 can take the form of a single diode, for example of standard type or of Schottky type, or else of a plurality of diodes, for example of Schottky diodes, mounted in parallel.

According to the invention, the first connecting branch B1 comprises, between the measurement point PM and the electronic control module BCM, second means of unidirectional current conduction Dd mounted in parallel with a two-position switch INT.

The two-position switch INT is configured to toggle between a closed short-circuit position of the second means of unidirectional current conduction Dd and an open position for diagnosing the loss of connection to the ground M of the electronic control module BCM on the first connecting branch B1.

The diagnostic circuit CD2 comprises means for generating a current Idiag at the level of the measurement point PM. These generating means take the form, in this example, of a current generator Idiag.

A diagnostic voltage V2diag is defined at the level of the measurement point PM as being the difference between the potential at the measurement point PM and an electronic ground m1 such as, for example, a ground of the electronic control module BCM.

Figure 4:
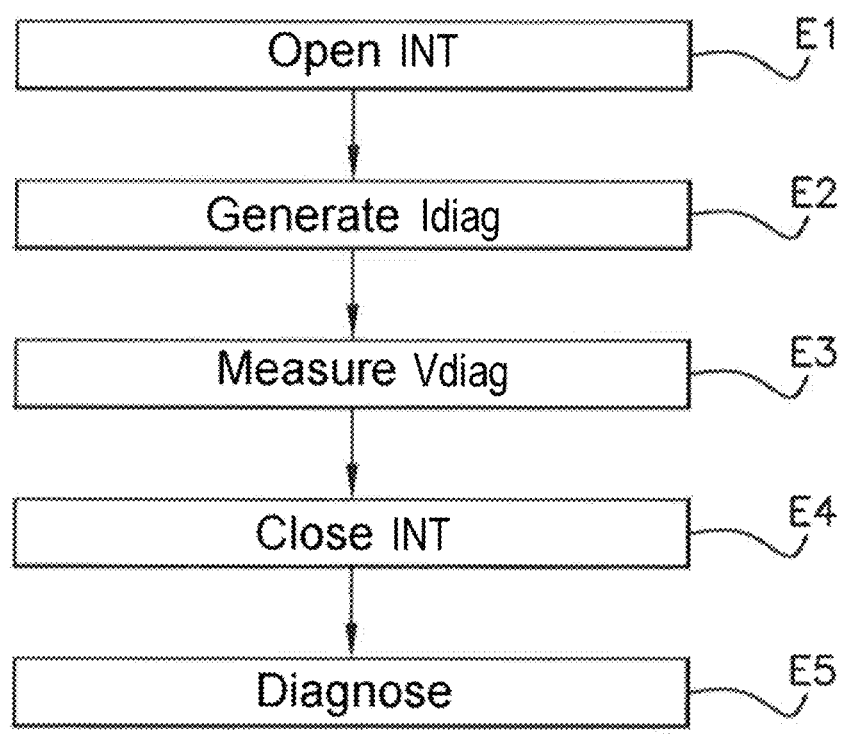
FIG. 4 illustrates an embodiment of the method according to the invention.

With reference to FIGS. 3 and 4, when no diagnosis of loss of the connection to the ground M of the electronic control module BCM on the first connecting branch B1 is carried out, the two-position switch INT is in the closed position for short-circuiting the diode Dd.

In order to diagnose a loss (or not) of the connection of the electronic control module BCM to the ground M on the first connecting branch B1, the microcontroller commands the opening of the two-position switch INT in a first step E1 (case represented in FIG. 3).

Next, in a second step E2, the microcontroller activates the current generator Idiag which may, for example, produce a pulsed current so as to reduce heat dissipation.

The current generated by the current generator Idiag makes it possible to prevent the voltage at the measurement point PM from being floating in case of disconnection of the first connecting branch B1.

The current generated by the current generator Idiag does not have any impact on the electronic control module BCM when the first connecting branch B1 is connected to the ground M since in this case said current is routed toward the ground M.

The diode Dd makes it possible to prevent the current generated by the current generator Idiag from returning toward the electronic control module BCM when the two-position switch INT is open.

Thereafter, in a third step E3, the microcontroller measures the voltage V2diag at the level of the measurement point PM. The voltage V2diag may be, for example, of the order of 10 to 100 mV.

In order to diagnose a loss (or not) of ground of the electronic control module BCM on the first connecting branch B1, when the two-position switch INT is open and when the current generator generates a current Idiag at the measurement point PM, the voltage V2diag at the measurement point PM is given by the following formula:

$$V2\text{diag} = Z_{ML} \times [I\text{diag} + I(\text{ECU1})] - U(D1) - Z_{MP} \times [I(\text{ECU2}) + I(\text{BCM})] \quad (3)$$

For conventional values of ZMP, I(ECU1), I(ECU2), I(BCM), V2diag and U(D1), for example for the values:
ZMP=0.02Ω,
I(BCM)=0.1 A,
I(ECU1)=0.2 A,
I(ECU2)=0.2 A,
U(D1)=0.2 V and
Idiag=2 A,
we have:

$$ZMP \times [I(ECU2)+I(BCM)] \ll ZML \times [Idiag+I(ECU1)]$$

$$ZMP \times [I(ECU2)+I(BCM)] \ll U(D1)$$

and $I(ECU1) \ll Idiag$, hence equation (3) can be simplified (by neglecting the terms with low values) to give the following relation:

$$V2diag \approx ZML \times Idiag - U(D1) \quad (4)$$

In a fourth step E4, the microcontroller closes the two-position switch INT and, in a fifth step E5, which may be at least in part concomitant with the fourth step E4, the microcontroller determines whether the measured voltage V2diag is greater or less than the predetermined voltage threshold so as to diagnose the loss of connection to the ground M of the electronic control module BCM on the first connecting branch B1.

When the measured voltage V2diag is less than the predetermined voltage threshold, the electronic control module is connected to the ground M via the first connecting branch B1. In the example hereinabove with reference to equations 3 and 4, when the first connecting branch B1 is connected, for:
ZML=0.3Ω,
U(D1)=0.2 V and
Idiag=2 A,
we have:

$$V2diag \approx 0.3 \times 2 - 0.2 = 0.4 \text{ V}$$

On the other hand, when the measured voltage V2diag is greater than the predetermined voltage threshold, the electronic control module is not connected to the ground M via the first connecting branch B1. Still in the example hereinabove with reference to equations 3 and 4, when the first connecting branch B1 is disconnected, we have:
ZML>0.5Ω,
U(D1)=0.2 V and
Idiag=2 A,
hence:

$$V2diag \geq 0.5 \times 2 - 0.2 = 0.8 \text{ V}$$

Thus, taking for example a predetermined voltage threshold of 0.6 V, a loss of connection to the ground M is diagnosed when V2diag>0.6 V.

The diagnosis of the loss of connection to the ground of the electronic control module BCM on the first connecting branch B1 is therefore advantageously both simple and reliable.

The invention claimed is:

1. A device for diagnosing the loss of a connection to a ground (M) of an electronic control module (BCM) of a motor vehicle, said device (1) comprising:
    a first branch (B1) connecting the main electronic control module (BCM) to the ground (M), said first connecting branch (B1) being designed to receive, at the level of a first connection point (P1), first control currents (I(ECU1)) originating from first electronic control units (ECU1),
    a second branch (B2) connecting the electronic control module (BCM) to the ground (M), said second connecting branch (B2) being designed to receive, at the level of a second connection point (P2), second control currents (I (ECU2)) originating from second electronic control units (ECU2), said second connecting branch comprising first means of unidirectional current conduction (D1) designed to block said second control currents (I(ECU2)) and,
    a diagnostic circuit (CD2) connected to the first connecting branch (B1), at the level of a measurement point (PM) situated between the electronic control module (BCM) and the first connection point (P1), and defining a diagnostic voltage (V2diag) for diagnosing a loss of connection to the ground (M) of the electronic control module (BCM) on the first connecting branch (B1),
    wherein the first connecting branch (B1) comprises:
        between the electronic control module (BCM) and the measurement point (PM), second means of unidirectional current conduction (Dd) mounted in parallel with a two-position switch (INT), said two-position switch (INT) being configured to toggle between a closed position for short-circuiting the second means of unidirectional current conduction (Dd) and an open position for diagnosing the loss of connection to the ground (M) of the electronic control module (BCM) on the first connecting branch (B1) and,
        means for generating a current (Idiag) at the level of the measurement point (PM).

2. The device as claimed in claim 1, wherein the means for generating a current comprise a current generator (Idiag).

3. The device as claimed in claim 2, wherein the two-position switch (INT) and the second means of unidirectional current conduction (Dd) take the form of a PMOS (P-type Metal-Oxide-Semiconductor) transistor mounted in reverse mode.

4. The device as claimed in claim 2, further comprising a microcontroller adapted for measuring the diagnostic voltage and for determining, on the basis of said measured voltage, a loss of connection between the electronic control module (BCM) and the ground (M) on the first connecting branch (B1).

5. The device as claimed in claim 2, wherein the first means of unidirectional current conduction (D1) take the form of a plurality of Schottky diodes mounted in parallel.

6. The device as claimed in claim 1, wherein the two-position switch (INT) and the second means of unidirectional current conduction (Dd) take the form of a PMOS (P-type Metal-Oxide-Semiconductor) transistor mounted in reverse mode.

7. The device as claimed in claim 6, further comprising a microcontroller adapted for measuring the diagnostic voltage and for determining, on the basis of said measured voltage, a loss of connection between the electronic control module (BCM) and the ground (M) on the first connecting branch (B1).

8. The device as claimed in claim 1, further comprising a microcontroller adapted for measuring the diagnostic voltage and for determining, on the basis of said measured voltage, a loss of connection between the electronic control module (BCM) and the ground (M) on the first connecting branch (B1).

9. The device as claimed in claim 8, wherein the microcontroller is adapted for controlling the means for generating a current (Idiag).

10. The device as claimed in claim 1, wherein the first means of unidirectional current conduction (D1) take the form of a plurality of Schottky diodes mounted in parallel.

11. A vehicle, especially a motor vehicle, comprising an electronic control module (BCM) and a device (1) as claimed in claim 1.

* * * * *